US007891979B2

(12) United States Patent
Chien et al.

(10) Patent No.: US 7,891,979 B2
(45) Date of Patent: Feb. 22, 2011

(54) RADIO FREQUENCY COXIAL CONNECTOR

(75) Inventors: Min-Lung Chien, Taipei Hsien (TW); Kai-Ray Cheng, Taipei Hsien (TW); Hong-Wei Zhang, Taipei Hsien (TW); Jian-Guang Guo, Taipei Hsien (TW)

(73) Assignee: Advanced Connectek Inc., Hsin-Tien (TW)

( * ) Notice: Subject to any disclaimer, the term of this patent is extended or adjusted under 35 U.S.C. 154(b) by 0 days.

(21) Appl. No.: 12/461,310

(22) Filed: Aug. 7, 2009

(65) Prior Publication Data

US 2010/0311272 A1 Dec. 9, 2010

(30) Foreign Application Priority Data

Jun. 3, 2009 (TW) .............................. 98209692 U

(51) Int. Cl.
*H05K 1/00* (2006.01)

(52) U.S. Cl. ........................................ 439/63; 439/188

(58) Field of Classification Search .................. 439/63, 439/188

See application file for complete search history.

(56) References Cited

U.S. PATENT DOCUMENTS

| | | | | |
|---|---|---|---|---|
| 6,761,571 | B2 * | 7/2004 | Hida | 439/188 |
| 6,783,374 | B2 | 8/2004 | Uratani et al. | |
| 6,843,673 | B1 * | 1/2005 | Liu et al. | 439/188 |
| 7,217,137 | B1 * | 5/2007 | Nakagawa | 439/63 |
| 7,632,123 | B2 * | 12/2009 | Nakagawa | 439/188 |
| 2001/0027033 | A1 * | 10/2001 | Fujimoto et al. | 439/63 |
| 2006/0128172 | A1 * | 6/2006 | Chien et al. | 439/63 |

* cited by examiner

*Primary Examiner*—Gary F. Paumen
(74) *Attorney, Agent, or Firm*—Bacon & Thomas, PLLC

(57) ABSTRACT

A RF coaxial connector has an insulative housing, an internal terminal and an external terminal. The insulative housing has a cavity. The internal terminal is mounted in the cavity and has a mounting section, two resilient arms protruding from the mounting section, a free section formed between the resilient arms and a contacting section protruding from the free section. The external terminal is mounted on the insulative housing. The internal terminal provides sufficient resistance force against a pin conductor of a corresponding connector engaged with the RF coaxial connector for stable signal transmission.

10 Claims, 7 Drawing Sheets

RADIO FREQUENCY COXIAL CONNECTOR

BACKGROUND OF THE INVENTION

1. Field of the Invention

The present invention relates to a connector, and more particularly to a radio frequency (RF) coaxial connector that has an internal terminal with a specific configuration to providing sufficient resistance force to tightly contact a contact of an external connector for stable signal transmission.

2. Description of Related Art

RF coaxial connectors are used popularly in various electronic devices and may be connected to a coaxial cable mounted on an antenna for wireless signal transmission.

U.S. Pat. No. 6,783,374 discloses a RF coaxial connector that has an insulative housing, an internal terminal and an external terminal. The insulative housing is composed of an upper casing and a bottom casing and has a socket. The internal terminal is formed by a stamping process, is mounted in the socket and has a connecting end and a free end. The connecting end is mounted securely on the insulative housing. The external terminal is exposed out of and covers the insulative housing. When the RF coaxial connector is connected to a corresponding connector, a pin conductor of the corresponding connector extends in the socket and presses against the internal terminal for signal transmission.

However, when aforementioned connectors are connected together, the pin conductor contacts a central portion of the internal terminal instead of the free end. Therefore, the segment from the central portion to the free end of the internal terminal would not provide pin conductor with its resilient force. Thus, the pin conductor loosely presses against the internal terminal, which makes the signal transmission between the connectors unstable.

To overcome the shortcomings, the present invention provides a RF coaxial connector to mitigate or obviate the aforementioned problems.

SUMMARY OF THE INVENTION

The main objective of the invention is to provide a RF coaxial connector that has an internal terminal with a specific configuration to providing sufficient resistance force to tightly contact a contact of an external connector for stable signal transmission.

A RF coaxial connector has an insulative housing, an internal terminal and an external terminal. The insulative housing has a cavity. The internal terminal is mounted in the cavity and has a mounting section, two resilient arms protruding from the mounting section, a free section formed between the resilient arms and a contacting section protruding from the free section. The external terminal is mounted on the insulative housing.

Other objectives, advantages and novel features of the invention will become more apparent from the following detailed description when taken in conjunction with the accompanying drawings.

DETAILED DESCRIPTION OF THE PREFERRED EMBODIMENT

Figure 1:
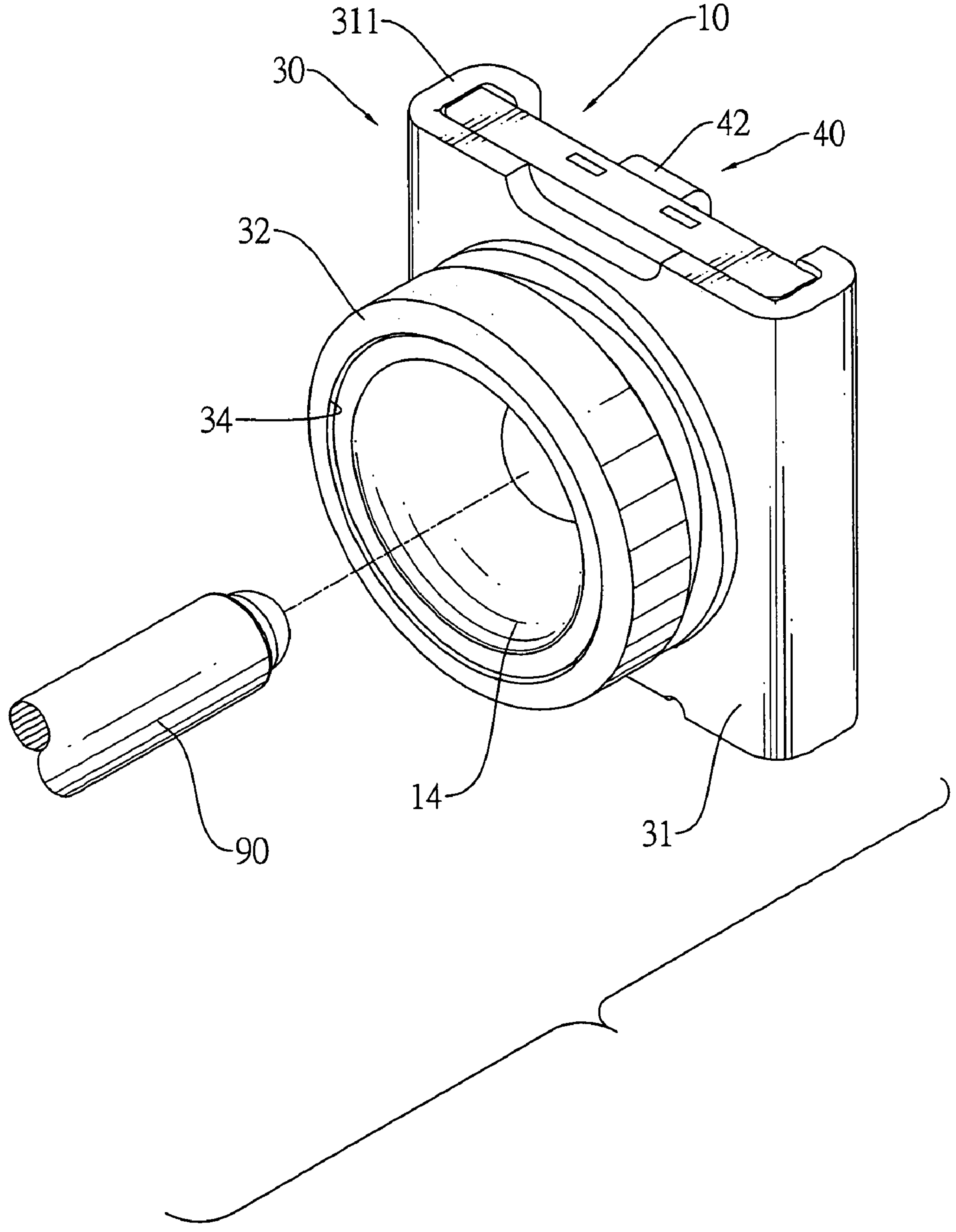
FIG. 1 is a partially exploded perspective view of a RF coaxial connector in accordance with the present invention with a pin conductor of another connector corresponding to the RF coaxial connector.
Figure 2:
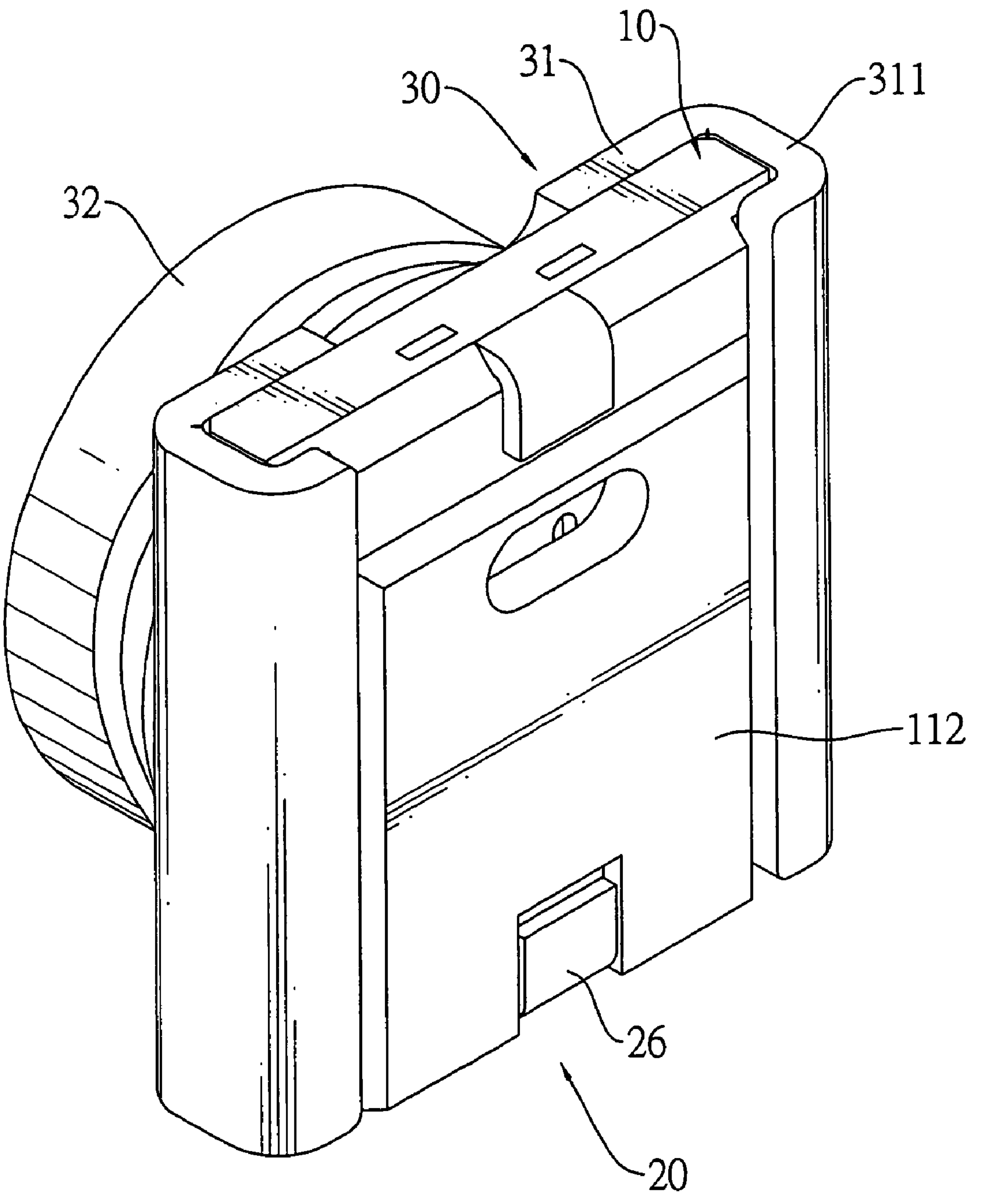
FIG. 2 is a perspective view of the RF coaxial connector in FIG. 1.
Figure 3:
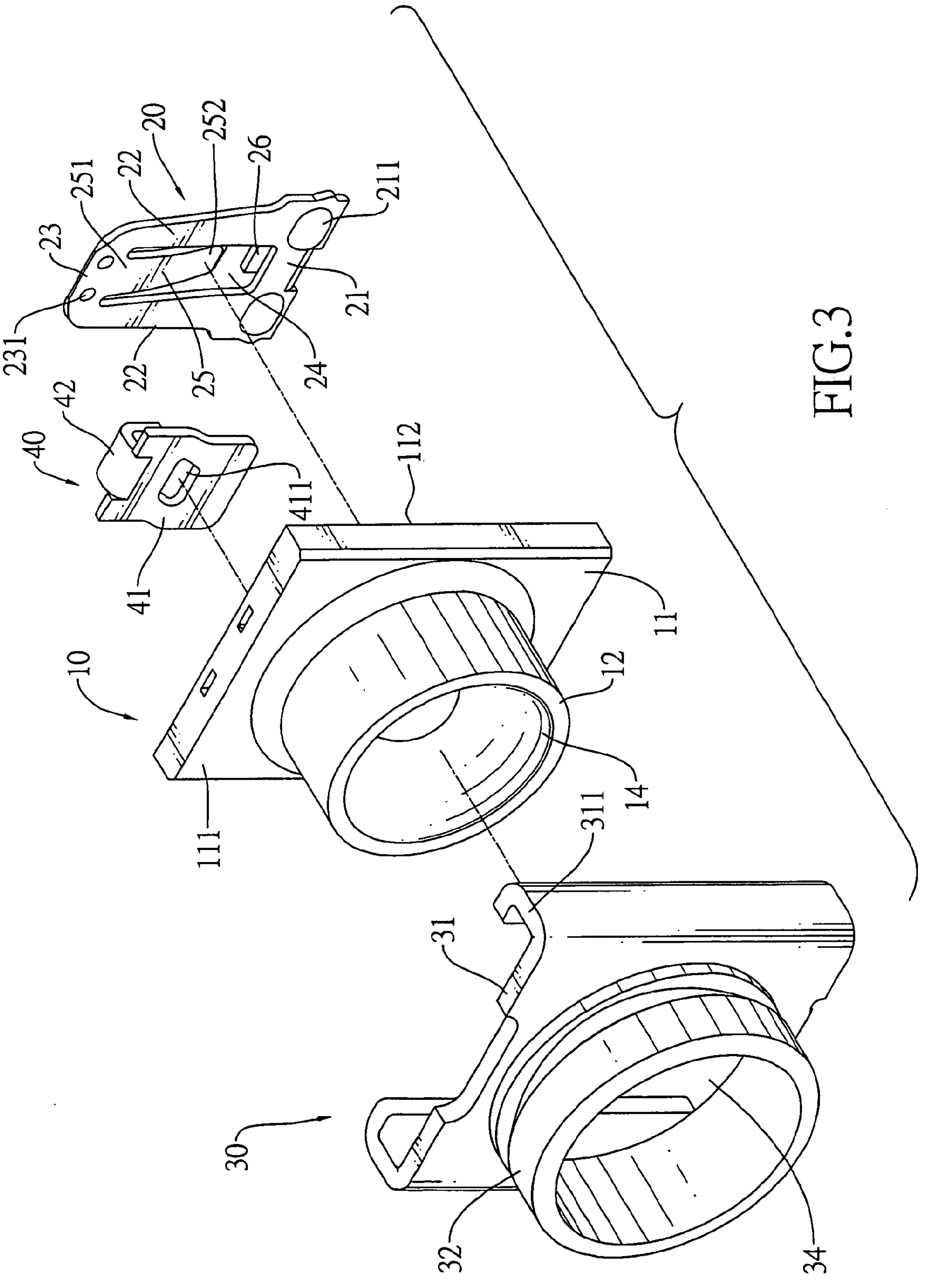
FIG. 3 is an exploded front perspective view of the RF coaxial connector in FIG. 1.
Figure 4:
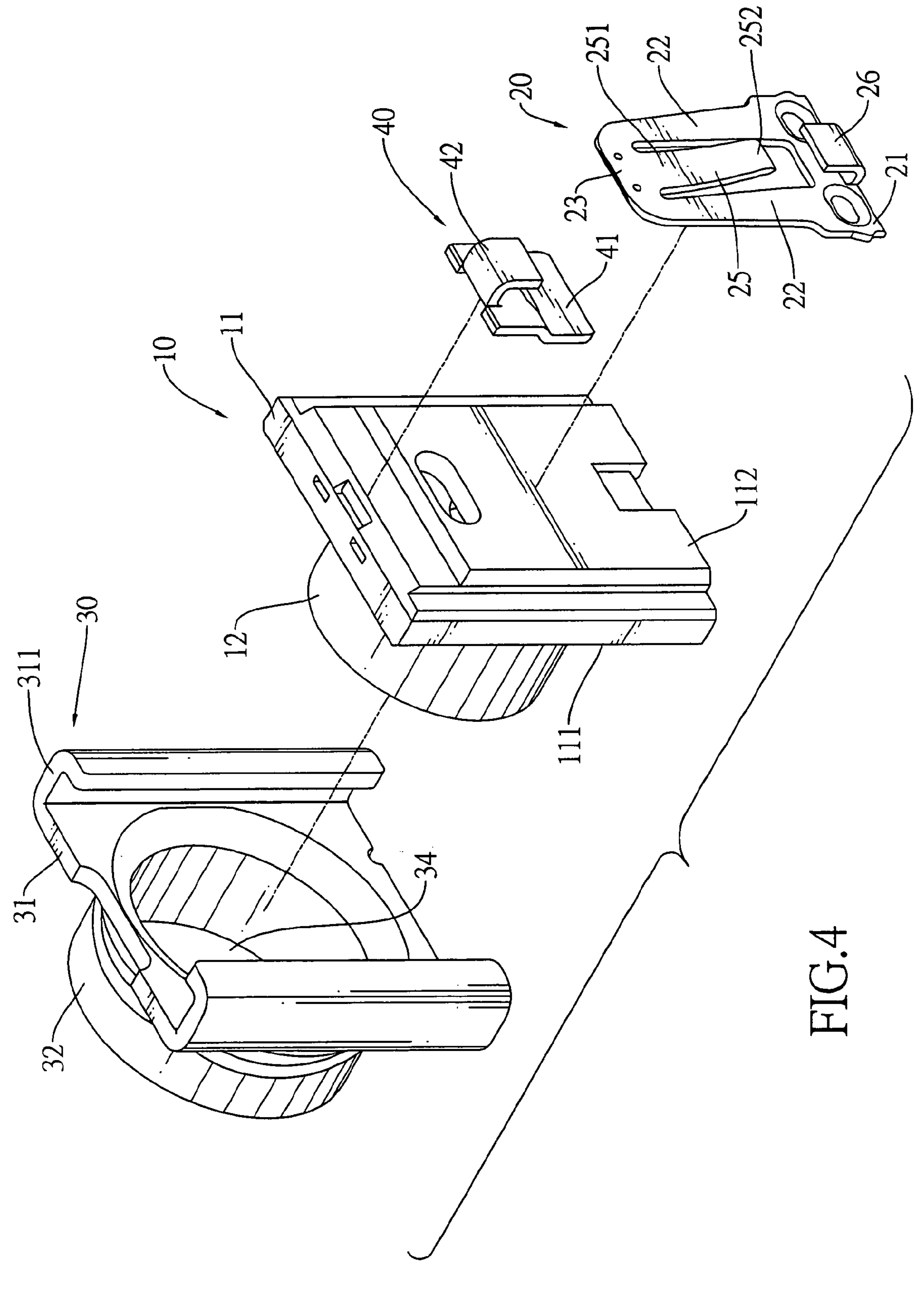
FIG. 4 is an exploded rear perspective view of the RF coaxial connector in FIG. 3.

With reference to FIGS. 1 to 4 and 7, a RF coaxial connector in accordance with the present invention may be a receptacle connector mounted in an electronic device and may be connected to a corresponding connector in a coaxial connector. The corresponding connector may be a plug connector and has a pin conductor (90).

The RF coaxial connector comprises an insulative housing (10), an internal terminal (20), an external terminal (30) and a detecting terminal (40).

The insulative housing (10) has a base (11) and a socket (12).

The base (11) has a front (11), a rear (112) and a cavity (13).

The cavity (13) is defined in the base (11) and may have a front inner wall (131) and a rear inner wall (132) opposite to the front inner wall (131).

The socket (12) is formed on and protrudes forward from the front (111) of the base (10) and has a socket hole (14). The socket hole (14) is defined in the socket (12), communicates with the cavity (13) and may be adjacent to the front inner wall (131).

Figure 5:
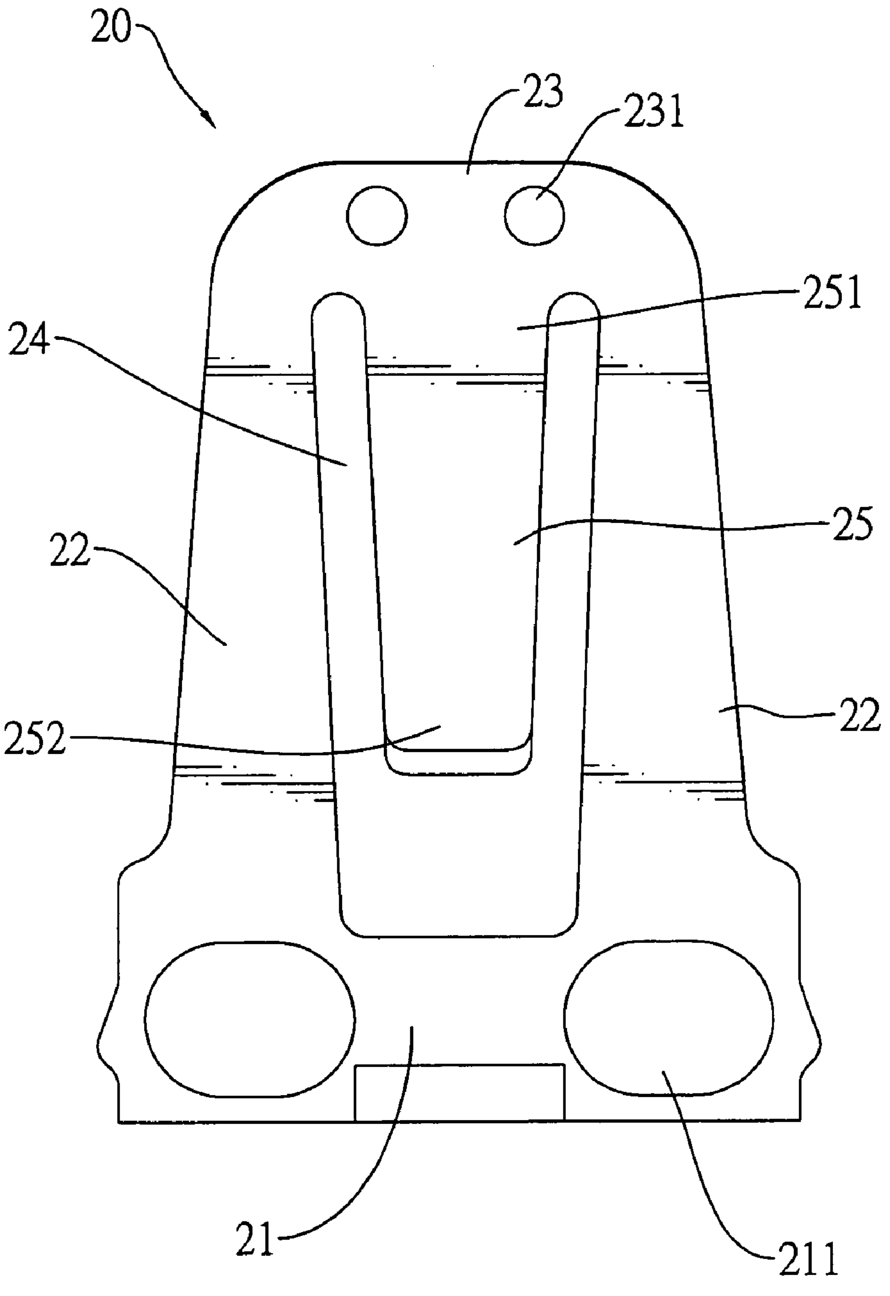
FIG. 5 is a front view of an internal terminal of the RF coaxial connector in FIG. 3.
Figure 6:
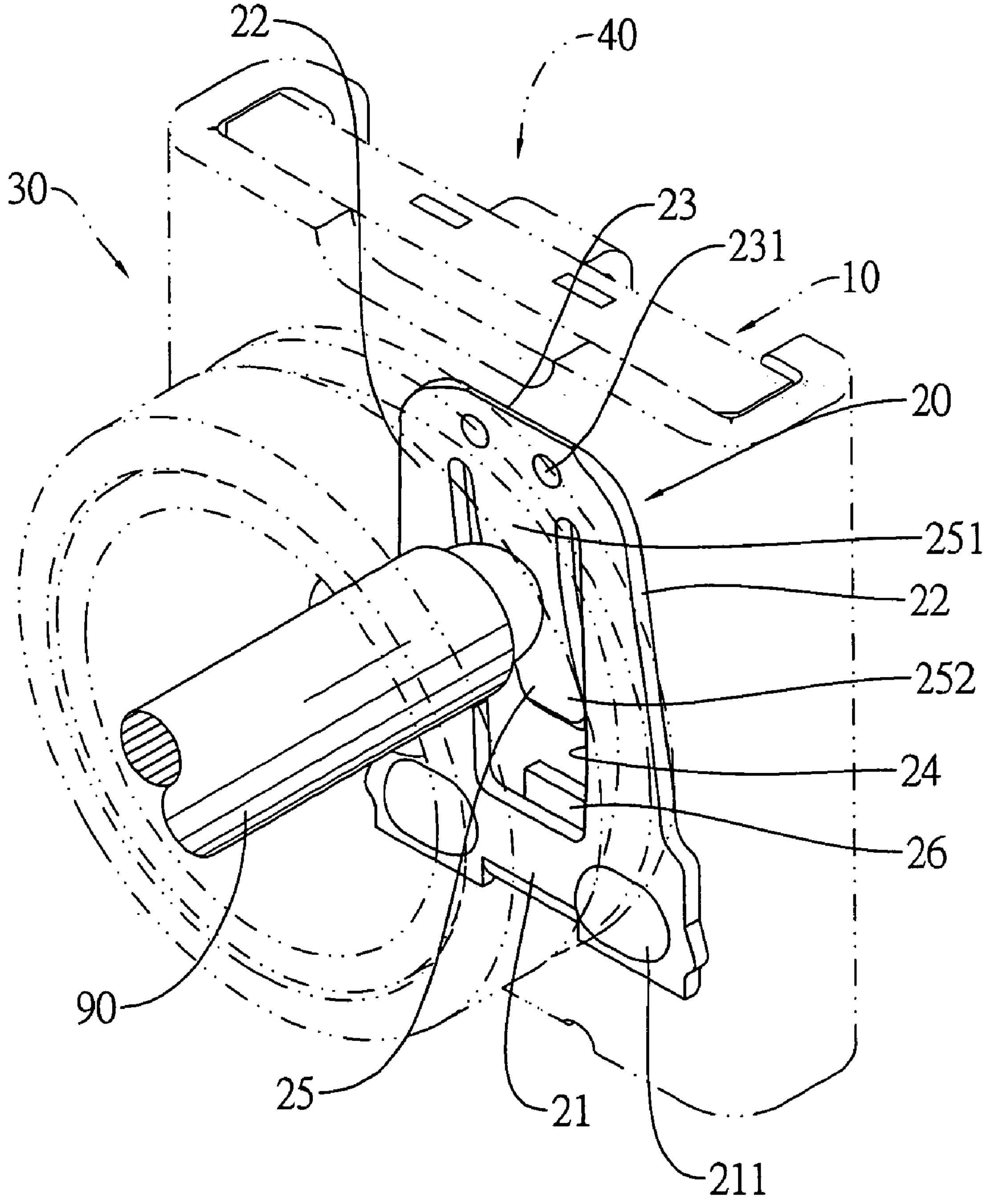
FIG. 6 is an operational perspective view of the pin conductor of the corresponding connector extending in the socket and contacting the internal terminal of the RF coaxial connector in FIG. 1.

With further reference to FIGS. 5 and 6, the internal terminal (20) is substantially m-shaped, is mounted in the cavity (13) of the insulative housing (10) and has a mounting section (21), two resilient arms (22), a free section (23), a contacting section (25) and a space (24).

The mounting section (21) is mounted securely in the cavity (13) of the insulative housing (10) and may further have multiple tightening protrusions (211) and a soldering tab (26). The tightening protrusions (211) are formed on and protrude forwards from the mounting section (21) and press tightly against the front inner wall (131) of the cavity (13) to prevent the mounting section (21) from inadvertently moving or falling off. The soldering tab (26) is L-shaped, is formed on and protrudes backward from the mounting section (21), extends through the base (11), is mounted on the rear (112) of the base (11) and may be soldered on a printed circuit board (PCB) of the electronic device. Furthermore, a contacting point between the mounting section (21) and the rear inner wall (132) of the cavity (13) serves as a fulcrum (F2).

The resilient arms (22) are formed on and protrude from the mounting section (21), selectively bend in the cavity (13) and each resilient arm (22) has a proximal and a distal end. The proximal end is formed on the mounting section (21).

The free section (23) is formed between the distal ends of the resilient arms (22) opposite to the mounting section (21) and may further have multiple contacting protrusions (231). The contacting protrusions (231) are formed on the free section (23).

Figure 7:
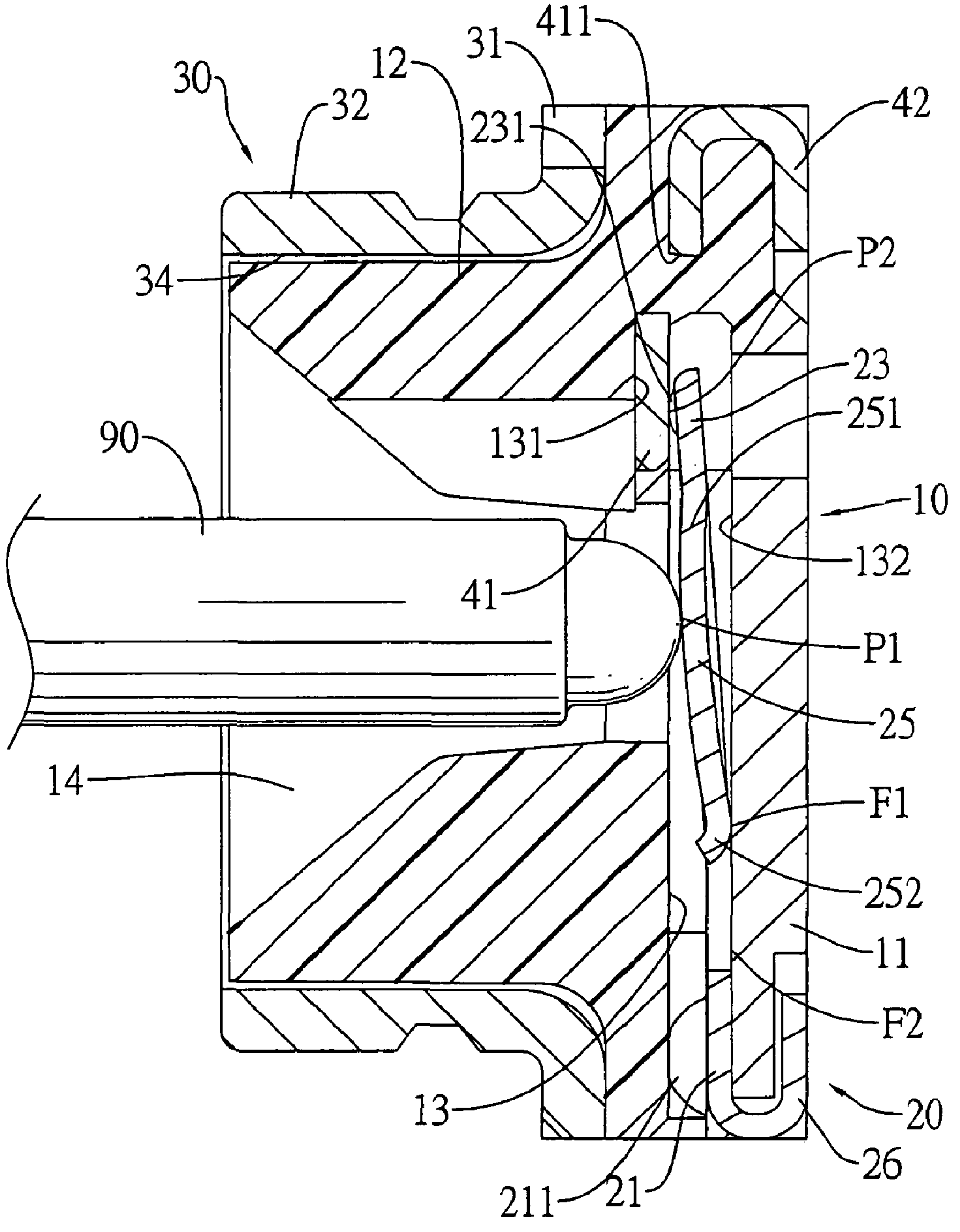
FIG. 7 is a side view in partial section of the RF coaxial connector and the pin conductor of the corresponding connector in FIG. 6.

The contacting section (25) is resilient, is formed on the free section (23), protrudes toward the mounting section (21), selectively bends and may have a connecting end (251) and a free end (252). The connecting end (251) is formed on the free section (23). The free end (252) is opposite to the connecting end (251) and presses against the rear inner wall (132) of the cavity (13) of the insulative housing (10). The pressing point between the free end (252) of the contacting section (25) and the rear inner wall (132) of the cavity (13) serves as a fulcrum (F1). Furthermore, a central portion of the contacting section (25) may contact the pin conductor (90) of the corresponding connector. A contacting point between the central portion of the contacting section (25) and the pin conductor (90) serves as a resistance point (P1), as shown in FIGS. 6 and 7.

The space (24) is U-shaped, is surrounded and defined by the mounting section (21), the resilient arms (22), the free section (23) and the contacting section (25). The space (24) prevents the contacting section (25) from contacting and rubbing against the resilient arms (22) and the mounting section (21).

The external terminal (30) covers the insulative housing (10) and has a plate (31), a sleeve (32) and a through hole (34).

The plate (31) is mounted on the front (111) of the base (11) of the insulative housing (10) and has two opposite side edges and two soldering wings (311). The soldering wings (311) are L-shaped, are formed respectively on and protrude from the side edges and hook on rear (112) of the base (111) and may be soldered on the PCB.

The sleeve (32) is formed on and protrudes from the plate (31) and is mounted around the socket (12).

The through hole (34) is defined through the sleeve (32) and the plate (31) and is mounted around the socket (12).

The detecting terminal (40) is mounted securely in the base (11) of the insulative housing (10) by an insert-molding process and has a contacting tab (41), a soldering tab (42) and a mounting hole (411).

The contacting tab (41) is mounted through the base (11) of the insulative housing (10), extends in the cavity (13) adjacent to the front inner wall (132) and selectively contacts the contacting protrusions (231) of the free section (23) of the internal terminal (20). When no external force is applied to the internal terminal (20), the free section (23) contacts the contacting tab (41). The contacting point between the free section (23) and the contacting tab (41) serves as a fulcrum and a resistance point (P2). Accordingly, the detecting terminal (40) may serve as a switch to activate or deactivate a circuit of the PCB. When the pin conductor (90) of the corresponding connector does not contact the internal terminal (20), the free section (23) of the internal terminal (20) contacts the contacting tab (41) of the detecting terminal (40) and keeps the circuit of the PCB deactivated. When the pin conductor (90) extends in the socket hole (14) of the insulative housing (10) and presses against the contacting section (25) of the internal terminal (20), the free section (23) of the internal terminal (20) separates from the contacting tab (41) of the detecting terminal (40) to activate the circuit of the PCB.

The soldering tab (42) is formed on and protrudes from the contacting tab (41), is mounted on the rear (11) of the base (11) of the insulative housing (10) and may be soldered on the PCB.

The mounting hole (411) is defined through the contacting tab (41) and is mounted around a part of the insulative housing (10) by the insert-molding process.

When the pin conductor (90) of the corresponding connector extends in the socket hole (14) and contacts the central portion of the contacting section (25) of the internal terminal (20), the internal terminal (20) provides resistance force as follows.

1. A segment of the contacting section (25) from the fulcrum (F1) to the resistance point (25) serves as a moment arm to provide resistance force against the pin conductor (90).

2. A segment of the contacting section (25) from the resistance point (P1) to the fulcrum (P2), i.e. the segment from the pin conductor (90) to the free section (23), serves as a moment arm to provide resistance force against the pin conductor (90).

3. A segment of each resilient arms (22) from the fulcrum (F2) to the resistance point (P2) serves as a moment arm to provide resistance force against the pin conductor (90).

Therefore, each part of the internal terminal (20) is fully used to provide sufficient resistance force against the pin conductor (90) so that the internal terminal (20) tightly contacts the pin conductor (90) to provide stable signal transmission.

Furthermore, each part of the internal terminal (20) are fully and evenly pressed and bent by the pin conductor (90) to prevent the internal terminal (20) from fatigue and irreversible deformation due to only few parts of the internal terminal (20) bearing all the pressure.

Even though numerous characteristics and advantages of the present invention have been set forth in the foregoing description, together with details of the structure and function of the invention, the disclosure is illustrative only. Changes may be made in the details, especially in matters of shape, size, and arrangement of parts within the principles of the invention to the full extent indicated by the broad general meaning of the terms in which the appended claims are expressed.

What is claimed is:

1. A radio frequency (RF) coaxial connector comprising:
- an insulative housing having
  - a base having
    - a front;
    - a rear; and
    - a cavity defined in the base and having a front inner wall and a rear inner wall opposite to the front inner wall; and
  - a socket formed on and protruding forward from the front of the base and having a socket hole defined in the socket and communicating with the cavity;
- an internal terminal mounted in the cavity of the insulative housing and having
  - a mounting section mounted securely in the cavity of the insulative housing;
  - two resilient arms formed on and protruding from the mounting section and each resilient arm having
    - a proximal formed on the mounting section; and
    - a distal end;
  - a free section formed between the distal ends of the resilient arms; and
  - a contacting section being resilient, formed on the free section, protruding toward the mounting section and having
    - a connecting end formed on the free section; and
    - a free end being opposite to the connecting end and pressing against the rear inner wall of the cavity; and
- an external terminal covers the insulative housing.

2. The RF coaxial connector as claimed in claim 1 further comprising a detecting terminal mounted securely in the base of the insulative housing and having a contacting tab mounted through the base of the insulative housing, extending in the cavity adjacent to the front inner wall and selectively contacting the free section of the internal terminal.

3. The RF coaxial connector as claimed in claim 2, wherein the internal terminal further has a space being U-shaped, surrounded and defined by the mounting section, resilient arms, free section and contacting section of the internal terminal.

4. The RF coaxial connector as claimed in claim 3, wherein the mounting section of the internal terminal has multiple tightening protrusions formed on and protruding from the mounting section and pressing tightly against the front inner wall of the cavity.

5. The RF coaxial connector as claimed in claim 4, wherein the free section of the internal terminal has multiple contacting protrusions formed on the free section selectively contacting the contacting tab of the detecting terminal.

6. The RF coaxial connector as claimed in claim 1, wherein the external terminal has a plate mounted on the front of the base of the insulative housing and having two opposite side edges;

a sleeve formed on and protruding from the plate and mounted around the socket; and a through hole defined through the sleeve and the plate and mounted around the socket.

7. The RF coaxial connector as claimed in claim 6, wherein the mounting section of the internal terminal has a soldering tab formed on and protruding backward from the mounting section, extending through the base and mounted on the rear of the base.

8. The RF coaxial connector as claimed in claim 7, wherein the plate of the external terminal further has two soldering wings formed respectively on and protruding from the side edges of the plate and hooking on the rear of the base of the insulative housing.

9. The RF coaxial connector as claimed in claim 2, wherein the detecting terminal further has a soldering tab formed on and protruding from the contacting tab and mounted on the rear of the base of the insulative housing.

10. The RF coaxial connector as claimed in claim 2, wherein the detecting terminal is mounted on the insulative housing by an insert-molding process.

* * * * *